United States Patent
Mizutani et al.

(10) Patent No.: US 11,655,538 B2
(45) Date of Patent: May 23, 2023

(54) PRECURSOR FOR CHEMICAL VAPOR DEPOSITION, AND LIGHT-BLOCKING CONTAINER CONTAINING PRECURSOR FOR CHEMICAL VAPOR DEPOSITION AND METHOD FOR PRODUCING THE SAME

(71) Applicant: KOJUNDO CHEMICAL LABORATORY CO., LTD., Sakado (JP)

(72) Inventors: Fumikazu Mizutani, Sakado (JP); Shintaro Higashi, Sakado (JP)

(73) Assignee: KOJUNDO CHEMICAL LABORATORY CO., LTD., Sakado (JP)

( * ) Notice: Subject to any disclaimer, the term of this patent is extended or adjusted under 35 U.S.C. 154(b) by 741 days.

(21) Appl. No.: 16/617,598

(22) PCT Filed: Jun. 4, 2018

(86) PCT No.: PCT/JP2018/021318
§ 371 (c)(1),
(2) Date: Nov. 27, 2019

(87) PCT Pub. No.: WO2018/225668
PCT Pub. Date: Dec. 13, 2018

(65) Prior Publication Data
US 2020/0181775 A1 Jun. 11, 2020

(30) Foreign Application Priority Data
Jun. 9, 2017 (JP) .............................. JP2017-113957

(51) Int. Cl.
*C01G 15/00* (2006.01)
*C23C 16/455* (2006.01)
(Continued)

(52) U.S. Cl.
CPC ........ *C23C 16/45553* (2013.01); *C01G 15/00* (2013.01); *C07F 5/00* (2013.01);
(Continued)

(58) Field of Classification Search
CPC ...................... H01L 31/1884; C23C 16/45553
See application file for complete search history.

(56) References Cited

U.S. PATENT DOCUMENTS

| 4,965,222 A | 10/1990 | Staring |
| 6,984,591 B1 | 1/2006 | Buchanan et al. |
| 2003/0180457 A1 | 9/2003 | Murakami et al. |

FOREIGN PATENT DOCUMENTS

| JP | H0194613 A | 4/1989 |
| JP | H02163930 A | 6/1990 |

(Continued)

OTHER PUBLICATIONS

Sugawara JPA 1991088324—Eng translation, Apr. 1991 (Year: 1991).*

(Continued)

*Primary Examiner* — Joseph A Miller, Jr.
(74) *Attorney, Agent, or Firm* — Buchanan Ingersoll & Rooney PC

(57) ABSTRACT

A precursor for chemical vapor deposition (CVD), which is a precursor for producing an indium oxide thin film by chemical vapor deposition, can be stored for a long period, and is easy to handle upon use when chemical vapor deposition is carried out; and a method for storing the precursor. A precursor for chemical vapor deposition, characterized by containing an alkylcyclopentadienylindium (I) ($C_5H_4R^1$—In) as a main component, also containing at least one component selected from alkylcyclopentediene ($C_5H_5R^2$), dialkylcyclopentadiene (($C_5H_5R^3)_2$), trisalkylcyclopentadienylindium (III) (($C_5H_4R^4)_3$—In) and triscyclo-
(Continued)

pentadienyl indium (III) as secondary components (wherein $R^1$ to $R^4$ independently represent an alkyl group having 1 to 4 carbon atoms), and containing substantially no solvents.

8 Claims, 1 Drawing Sheet

(51) Int. Cl.
  *C07F 5/00* (2006.01)
  *C23C 16/40* (2006.01)
  *H01B 1/08* (2006.01)
  *H01B 13/00* (2006.01)
(52) U.S. Cl.
  CPC .............. *C23C 16/407* (2013.01); *H01B 1/08* (2013.01); *H01B 13/0036* (2013.01)

(56) References Cited

FOREIGN PATENT DOCUMENTS

| JP | H0388324 A | 4/1991 |
|---|---|---|
| JP | H03190123 A | 8/1991 |
| JP | 2002060944 A | 2/2002 |
| JP | 2015506416 A | 3/2015 |
| KR | 20030066459 A | 8/2003 |

OTHER PUBLICATIONS

Notification of Reason for Refusal dated Aug. 2, 2021, by the Korean Intellectual Property Office in corresponding Korean Patent Application No. 10-2019-7037606, and an English translation of the Notification. (11 pages).

International Search Report (PCT/ISA/210) dated Jul. 24, 2018, by the Japanese Patent Office as the International Searching Authority for International Application No. PCT/JP2018/021318.

Written Opinion (PCT/ISA/237) dated Jul. 24, 2018, by the Japanese Patent Office as the International Searching Authority for International Application No. PCT/JP2018/021318.

Beachley, Jr., O. T., et al., "Chemistry of $In(C_5H_5)_3$ and Some Heteroleptic Organoindium(III) Derivatives. Crystal and Molecular Structures of $In(C_5H_5)_3$, $(C_5H_5)_3In \cdot PPh_3$, and $(Me_3CCh_2)_2In(C_5H_5)$", Organometallics, 2002, 21 (22), pp. 4632-4640.

Elam, J. W., et al., "Indium Oxide ALD using Cyclopentadienyl Indium and Mixtures of $H_2O$ and $O_2$", ECS Transactions, 2011, 41 (2), pp. 147-155.

* cited by examiner

US 11,655,538 B2

PRECURSOR FOR CHEMICAL VAPOR DEPOSITION, AND LIGHT-BLOCKING CONTAINER CONTAINING PRECURSOR FOR CHEMICAL VAPOR DEPOSITION AND METHOD FOR PRODUCING THE SAME

TECHNICAL FIELD

The present invention relates to a precursor for chemical vapor deposition for the formation of indium-containing oxide films by chemical vapor deposition (CVD), a light-blocking container charged with the precursor and the method for producing the same.

BACKGROUND ART

Transparent conductive films are used for solar cells, liquid crystal display devices, electrodes of various other photodetectors, and so forth, due to its conductivity and excellent visible light transmission. They are also used for reflection films for windowpanes of automobiles and buildings, various antistatic films and so on by utilizing the reflection/absorption characteristics in the near infrared ray region.

Zinc oxide, indium oxide, etc. are usually used for transparent conductive films. The zinc oxide contains aluminum, gallium, indium or tin as a dopant. The indium oxide contains tin, tungsten or titanium as a dopant. In particular, indium oxide films doped with tin, which are called ITO films, are widely used in industrial fields as low-resistant transparent conductive films.

The method of preparing such transparent conductive films may use physical vapor deposition (PVD) and chemical vapor deposition (CVD). According to atomic layer deposition (ALD) which is one kind of chemical vapor deposition (CVD), films having uniform thickness at atomic level can be formed on the uneven surface.

For example, Non-patent Literature (NPL) 1 shows that uniform transparent conductive indium oxide films are formed by exposing to cyclopentadienylindium (I), water and oxygen in this order, by ALD process using cyclopentadienylindium (I) and two oxygen sources which are water and oxygen.

Patent Literature (PTL) 1, in which indium-containing oxide films are formed by ALD process using indium compounds that are liquid at normal room temperature, reveals that cyclopentadienylindium (I) is not fit for larger area transparent substrates because it is solid.

In PTL 2, epitaxial InP layers are formed on a substrate by metalorganic vapor phase epitaxy (MOVPE) process using cyclopentadienylindium (I) or alkylcyclopentadienylindium (I) as a precursor of indium, and ethylcyclopentadienylindium (I) that is liquid at normal room temperature is mentioned. However, there is a problem that the cyclopentadienylindium (I) is sensitive to heat, light and air.

As for stability of cyclopentadienylindium (I), NPL 2 discloses that triscyclopentadienylindium (III) stabilizes cyclopentadienylindium (I) when cyclopentadienylindium (I) and triscyclopentadienylindium (III) are allowed to coexist in THF. However, for stabilization by this method, other indium compounds must coexist in THF. Hence handling is not simple in using.

As mentioned above, while good indium-containing oxide films can be formed when cyclopentadienylindium (I) is used as a precursor of indium, cyclopentadienylindium (I) has a problem that stable preservation and handling are not easy because of its extreme sensitiveness to heat, light and air. However in another aspect, the precursor is preferably liquid at normal room temperature in case it is applied to larger area substrates.

CITATION LIST

Patent Literature

PTL 1: Japanese Translation of PCT International Application Publication No. 2015-506416
PTL 2: U.S. Pat. No. 4,965,222

Non-Patent Literature

NPL 1: ECS Transactions, 41 (2) 147-155 (2011)
NPL 2: Organometallics, 21 (22) 4632-4640 (2002)

SUMMARY OF INVENTION

Technical Problem

An object of the present invention is to provide a precursor for the formation of indium-containing oxide films by chemical vapor deposition (CVD) such as atomic layer deposition (ALD), that is to say, a precursor that can be stably preserved and is easy to handle when used in process of chemical vapor deposition (CVD), and a method of producing the same.

Solution to Problem

The present inventor has investigated indium compounds that can solve the foregoing problems of the prior arts, and has found that alkylcyclopentadienylindium (I) ($C_5H_4R^1$—In) can be stabilized under the coexistence with alkylcyclopentadiene ($C_5H_5R^2$), dialkylcyclopentadiene (($C_5H_5R^3$)$_2$) or trisalkylcyclopentadienylindium (III) (In($C_5H_4R^4$)$_3$).

The present invention contains the items below.

The precursor for chemical vapor deposition of the present invention comprises alkylcyclopentadienylindium (I) ($C_5H_4R^2$—In; $R^2$ is an alkyl group having 1-4 carbon atoms) as a main component, and one or more selected from alkylcyclopentadiene ($C_5H_5R^2$; $R^2$ is an alkyl group having 1-4 carbon atoms), dialkylcyclopentadiene (($C_5H_5R^3$)$_2$; $R^3$ is an alkyl group having 1-4 carbon atoms), trisalkylcyclopentadienylindium (III) (In($C_5H_4R^4$)$_3$; $R^4$ is an alkyl group having 1-4 carbon atoms) and triscyclopentadienylindium (III) as secondary components and contains substantially no solvents.

The secondary component preferably includes alkylcyclopentadiene or dialkylcyclopentadiene, and then $R^2$ or $R^3$ is preferably the same as $R^1$.

The secondary component also preferably includes trisalkylcyclopentadienylindium (II), and then $R^4$ is preferably the same as $R^2$.

More preferable is that the number of carbon atoms of $R^1$ to $R^4$ is equal and further that the number of the carbon atoms is 2.

The precursor for chemical vapor deposition is preferably liquid at 23° C.

In the precursor for chemical vapor deposition, a total amount of hydrogen of alkylcyclopentadiene, dialkylcyclopentadiene and trisalkylcyclopentadienylindium (III) to an amount of hydrogen of alkylcyclopentadienylindium (I), calculated using integrated value of each signal measured by $^1$H-NMR, is preferably 0.01 or more and less than 0.5.

The light-blocking container of the present invention, being charged with the precursor for chemical vapor deposition, is mountable on a chemical vapor deposition apparatus. The amount of In metal contained in the precursor for chemical vapor deposition is preferably 0.1 wt % or less.

The method of manufacturing a light-blocking container containing a precursor for chemical vapor deposition, which is mountable on a chemical vapor deposition apparatus, according to the present invention, comprises: a step 1 of preparing a precursor by allowing alkylcyclopentadienylindium (I) ($C_5H_4R^1$—In) as a main component to coexist with one or more selected from alkylcyclopentadiene ($C_5H_5R^2$), dialkylcyclopentadiene (($C_5H_5R^3$)$_2$), trisalkylcyclopentadienylindium (III) (In($C_5H_4R^4$)$_3$) and triscyclopentadienylindium (III) as secondary components, and a step 2 of charging a light-blocking container mountable on a chemical vapor deposition apparatus with the precursor in an inert gas. Each of $R^1$ to $R^4$ represents an alkyl group having 1 to 4 carbon atoms.

Advantageous Effects of Invention

According to the present invention, alykylcyclopentadienylindium (I) is stabilized by allowing alkylcyclopentadienylindium (I) ($C_5H_4R^1$—In) as a main component to coexist with alkylcyclopentadiene, dialkylcyclopentadiene, trisalkylcyclopentadienylindium (III) or triscyclopentadienylindium (III) as a secondary component, thereby making it perservable even at room temperature (23° C.) as long as it is light-shielded in an inert gas atmosphere. Accordingly, the precursor for chemical vapor deposition according to the present invention is easy to handle when indium-containing oxide films are formed by chemical vapor deposition (CVD).

DESCRIPTION OF EMBODIMENTS

Figure 1:
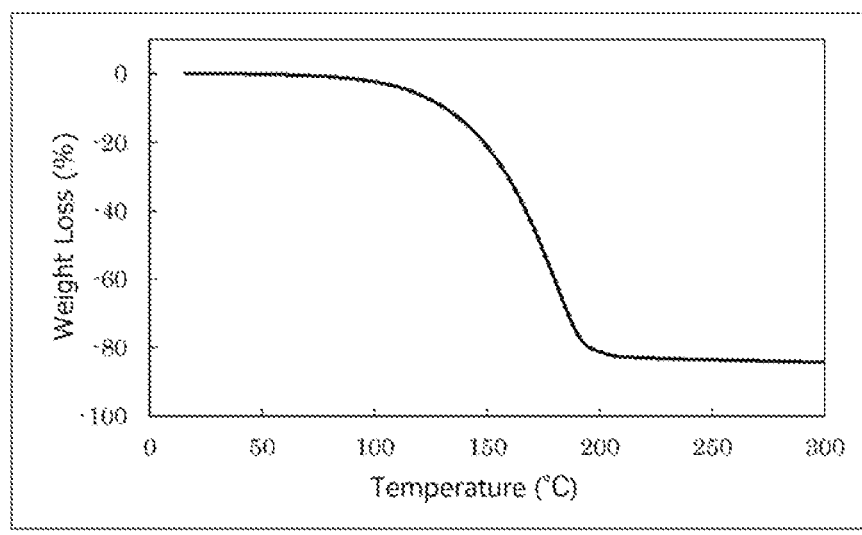
FIG. 1 shows the result of TG analysis in Example 1.

The precursor for chemical vapor deposition of the present invention comprises alkylcyclopentadienylindium (I) ($C_5H_4R^1$—In) represented by formula (1) as a main component, and one or more selected from alkylcyclopentadiene ($C_5H_5R^2$) and dialkylcyclopentadiene (($C_5H_5R^3$)$_2$) represented by formula (2), trisalkylcyclopentadienylindium (III) (In($C_5H_5R^4$)$_3$) represented by formula (3) and triscyclopentadienylindium (III) as secondary components, and contains substantially no solvents. $R^1$ to $R^4$ are each independently an alkyl group having 1-4 carbon atoms.

[Chem. 1]

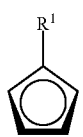

(1)

[Chem. 2]

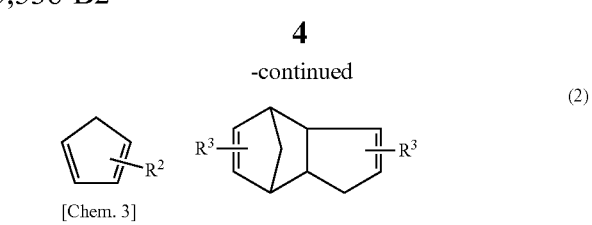

[Chem. 3]

Hereinafter, the above precursor for chemical vapor deposition is described in detail.

The precursor for chemical vapor deposition of the present invention is the one for manufacturing indium-containing oxide films by chemical vapor deposition method, mainly comprising alkylcyclopentadienylinidium (I) ($C_5H_4R^1$—In).

$R^1$ to $R^4$ are each independently an alkyl group having 1 to 4 carbon atoms. The alkyl groups having 1 to 4 carbon atoms are preferably ethyl group, n-propyl group and n-butyl group, and ethyl group is especially preferable.

As for $\eta^5$-cyclopentadienylindium (I) (In($C_5H_5$)), namely, when in formula (1), $R^1$ is not an alkyl group but hydrogen atom, the melting point is about 170° C. and the distillation is difficult.

The precursor for chemical vapor deposition is featured by substantially not containing solvents.

Herein, according to NPL 2, triscyclopentadienylindium (III) stabilizes cyclopentadienylindium (I) when both of them are made to exist in THF, and the THF solution maintains the pale yellow color for not less than four months at 20° C.; on the other hand, the THF solution containing solely cyclopentadienylindium (I) is pale yellow at first, but after the temperature rising from −196° C. to 20° C. and 20 minutes later, it turns brown and finally dark brown nearly black.

The consideration from NPL 2 is that In($C_5H_5$) is hardly decomposed in the THF solution containing In($C_5H_5$)$_3$ and In($C_5H_5$), because In($C_5H_5$)$_3$ and In($C_5H_5$) exchange each other's $C_5H_5$ moiety via THF·($C_5H_5$)$_2$In—In($C_5H_5$)$_2$·THF.

In the present invention, alkylcyclopentadienylindium (I) ($C_5H_4R^1$—In) is stabilized without using substantially any solvent, which clearly demonstrates the different stabilization mechanism from the one explained in the foregoing literature.

The precursor for chemical vapor deposition comprises one or more selected from alkylcyclopentadiene, dialkylcyclopentdiene, trisalkylcyclopentadienylindium (III) and triscyclopentadienylindium (III) as secondary components for the stabilization of alkylcyclopentadienylindium (I).

The mechanism of stabilizing the precursor for chemical vapor deposition is herein described. Alkylcyclopentadienylindium (I) ($C_5H_4R^1$—In) causes the disproportionation reaction as shown below by light and heat at room temperature.

$$3(C_5H_4R^1-In) \rightarrow 2In + In(C_5H_4R^1)_3$$

However, when the above secondary component, namely alkylcyclopentadiene, dialkylcyclopentadiene, trisalkylcyclopentadienylindium (III) or triscyclopentadienylindium (III) is made to coexist in this system, it prevents the progress of disproportionation reaction to stabilize alkylcyclopentadienylindium (I).

The above disproportionation reaction is an endothermic reaction with relatively low activation energy. Presumably, when above any secondary component exists, the reaction hardly proceeds toward disproportionation even if alkylcyclopentadienylindium (I) is excited to an activated state, and consequently an original state of alkylcyclopentadienylindium (I) is restored. Therefore, $R^2$ to $R^4$ are preferably the same as $R^1$, and further all of $R^1$ to $R^4$ are more preferably ethyl group.

Any one of alkylcyclopentadiene, dialkylcyclopentadiene, trisalkylcyclopentadienylindium (III) and triscyclopentadienylindium (III) or a combination of two or more thereof may be also added.

When alkylcyclopentadiene and dialkylcyclopentadiene are added to the precursor for chemical vapor deposition, a total amount of hydrogen of alkylcyclopentadiene and dialkylcyclopentadiene to an amount of hydrogen of alkylcyclopentadienylindium (I), calculated using integrated value of each signal measured by $^1$H-NMR, is 0.01 or more and less than 0.5.

When trisalkylcyclopentadienylindium (III) or triscyclopentadienylindium (III) is added to the precursor for chemical vapor deposition, a total amount of hydrogen of trisalkylcyclopentadienylindium (III) to an amount of hydrogen of alkylcyclopentadienylindium (I), calculated using integrated value of each signal measured by $^1$H-NMR, is 0.01 or more and less than 0.5.

When alkylcyclopentadiene and/or dialkylcyclopentadiene and triscyclopentadienylindium (III) are added to the precursor for chemical vapor deposition, a total amount of hydrogen of alkylcyclopentadiene, dialkylcyclopentadiene and triscyclopentadienylindium (III) to an amount of hydrogen of alkylcyclopentadienylindium (I), calculated using integrated value of each signal measured by $^1$H-NMR, is 0.01 or more and less than 0.5.

Alkylcyclopentadienylindium (I) which is a main component in the precursor for chemical vapor deposition, can be synthesized by known methods. For example, when $R^1$ is ethyl group, butyllithium reacts with an equimolar amount of ethylcyclopentadiene in an inert gas atmosphere to produce ethylcyclopentadienyllithium, and then to the resultant product is added an equimolar amount of indium monochloride powder in diethyl ether to produce ethylcyclopentadienylindium (I). Since ethylcyclopentadienylindium (I) is extremely sensitive to light, the reaction system should be light-shielded after addition of indium monochloride. After that, the crude product is purified by distillation under reduced pressure to obtain pale yellow ethylcyclopentadienylindium in a receiver cooled by dry ice.

The present invention features that the method of manufacturing the precursor for chemical vapor deposition comprises a step 1 of allowing alkylcyclopentadienylindium (I) as a main component to coexist with one or more selected from alkylcyclopentadiene, dialkylcyclopentadiene, trisalkylcyclopentadienylindium (III) and triscyclopentadienylindium (III) as secondary components, and a step 2 of charging a light-blocking container mountable on a chemical vapor deposition apparatus with the secondary components and alkylcyclopentadienylindium (I) in an inert gas.

In the step 1, the method of allowing the secondary component, namely alkylcyclopentadiene, dialkylcyclopentadiene, trisalkylcyclopentadienylindium (III) or triscyclopentadienylindium (III) to coexist is not particularly limited, but the addition immediately after the main component is purified by distillation is an effective way.

Generally, precursors for chemical vapor deposition have some vapor pressure even at room temperature and thus the distilled products are to be collected while cooling them. However, when alkylcyclopentadienylindium (I) is collected under a low temperature of −79° C. or less by means of dry ice or something, the disproportionation reaction is relatively hardly caused while solid at low temperature, but once the temperature increases and alkylcyclopentadienylindium (I) becomes liquid, the disproportionation reaction drastically proceeds.

Accordingly, it is preferable that alkylcyclopentadiene and dialkylcyclopentadiene should be added to the one in solid state just after purification by distillation; alternatively, they may be added before distillation and collected together with alkylcyclopentadienylindium (I).

When alkylcyclopentadienylindium (I) purified by distillation reacts with water, the reaction below produces alkylcyclopentadiene.

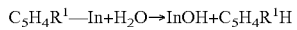

Since InOH is solid, the supernatant liquid can give the coexistent system of alkylcyclopentadiene thus obtained and/or dialkylcyclopentadiene in which the alkylcyclopentadiene dimerizes with itself.

In case trisalkylcyclopentadienylindium (III) or triscyclopentadienylindium (III) is added, trisalkylcyclopentadienylindium (III) etc. are produced by disproportionation. Hence, the supernatant of the disproportionated mixture can be used without any trouble to synthesize the one separately.

In the step 1, alkylcyclopentadienylindium (I) that has been put into a state of coexistence of alkylcyclopentadiene, dialkylcyclopentadiene, trisalkylcyclopentadienylindium (III) or triscyclopentadienylindium (III) as a secondary component, is filled into a light-blocking container which is mountable on a chemical vapor deposition apparatus in an inert gas atmosphere in the step 2.

Here, even if alkylcyclopentadienylindium (I) that is not stabilized is poured into the container for the precursor for chemical vapor deposition in the step 2 directly without the step 1, it can be stabilized by the disproportionation after filling. However, In metal precipitates by disproportionation in filling easily cause blockage, which leads to problems of not being easy to handle and precipitating a large amount of In metals in the container.

When the charging is done by the method according to the present invention, the amount of In metal in the container is substantially zero right after charging, and 0.5 wt % or less just before use as the precursor for vaporization. In other words, the amount of In metal in the container is kept at 0.5 wt % or less even after the lapse of a long time.

The precursor for chemical vapor deposition of the present invention obtained through such a step 1 does not comprise any solvents and substantially comprises only the main component and the secondary components, and in the step 2, can be easily filled into a light-blocking container mountable on a chemical vapor deposition apparatus in an inert gas. The precursor for chemical vapor deposition is liquid at 23° C. under ordinary pressure.

The precursor for chemical vapor deposition of the present invention comprises one or more selected from alkylcyclopentadiene, dialkylcyclopentadiene, trisalkylcyclopentadienylindium (III) and triscyclopentadienylindium (III) as secondary components. Of these, alkylcyclopentadiene and dialkylcyclopentadiene, vaporizing at low temperatures, cause no problem for the film formation if they are completely vaporized before used for chemical vapor deposition. Trisalkylcyclopentadienylindium (III), and In metal produced by the disproportionation have almost no vapor pressure within the temperature range where alkylcyclopentadienylindium (I) as a main component vaporizes. Hence, there are no problems using them for chemical vapor deposition. However, some secondary components may slightly change the vapor pressure of the main component, depending on how they have been preserved after filled into the container for the precursor for chemical vapor deposition. Therefore, it is more desirable that ALD (atomic layer deposition) which is hardly affected by the change of vapor pressure should be used.

EXAMPLES

Hereinafter, the present invention is described in further detail with reference to examples but the present invention is not restricted to these examples.

Example 1

Butyllithium (BuLi) reacted with an equimolar amount of ethylcyclopentadiene ($C_5H_4EtH$) in hexane to synthesize ethylcyclopentadienyllithium ($C_5H_4EtLi$). After synthesis, hexane solvent was removed by distillation under reduced pressure to obtain solid ethylcyclopentadienyllithium. Next, after obtaining a suspension by adding diethyl ether, to the suspension was added 1.2 mol times the amount of finely pulverized indium monochloride (InCl) to synthesize ethylcyclopentadienylindium. After addition of indium monochloride, the reaction was performed under a shading condition except when the procedure was confirmed. After removal of diethyl ether from the obtained suspension under reduced pressure, the resultant product was distilled under reduced pressure to give ethylcyclopentadienylindium as a pale yellow solid in a receiver cooled by dry ice.

As was supposed ethylcyclopentadienylindium extremely sensitive to light and heat, the above reactions were performed in an inert gas atmosphere.

When the receiver was stored in a shading state in an inert gas atmosphere for several days, reddish-brown coloration leading to the precipitation of indium metal was observed. No indium metal precipitates were observed even after the liquid in which the indium metal was precipitated was poured into an ampule filled with an inert gas and stored in a light-shielded state for several days. $^1$H-NMR (400 MHz; UNITY INOVA 400 S produced by Varian) measured for the reddish-brown liquid revealed signals similar to those from measurement of ethylcyclopentadiene in addition to the signals attributed to ethylcyclopentadienylindium. The amount of hydrogen (integrated value) of ethylcyclopentadiene and diethylcyclopentadiene to the amount of hydrogen (integrated value) of ethylcyclopentadienylindium was 0.2. When the liquid in which indium metal was precipitated out and turned reddish-brown was distilled under vacuum at 100° C., ethylcyclopentadienylindium was obtained as a pale yellow solid, and the brown liquid likely to be trisethylcyclopentadienylindium (III) was left in the receiver. The results demonstrated that ethylcyclopentadienylindium was stabilized under the coexistence with trisethylcyclopentadienylindium produced by the disproportionation.

TG analysis (TG-DTA 2000 S produced by BRUKER AXS) of the reddish-brown liquid showed that any weight loss caused by other than vaporization of ethylcyclopentadienylindium was not observed as shown in FIG. 1. The reason why the weight loss did not reach 100% was that none of the secondary components had vapor pressure within the measured range.

Example 2

In a manner similar to Example 1, a pale yellow solid of ethylcyclopentadienylindium was obtained in a receiver cooled by dry ice.

Next, the receiver was stored at room temperature in an inert gas for several days to melt the solid into a reddish-brown liquid. At this point, indium metal precipitates were observed. Ethylcyclopentadiene was added to the reddish-brown liquid, and the mixture was distilled under reduced pressure to produce a solid mixture of ethylcyclopentadienylindium and ethylcyclopentadiene in the receiver cooled by dry ice. $^1$H-NMR measured for the yellow to reddish-brown liquid melted from the mixture revealed signals similar to those from measurement of ethylcyclopentadiene stored at normal room temperature in addition to the signals of ethylcyclopentadienylindium. The result confirmed that a mixture of ethylcyclopentadienylindium and ethylcyclopentadiene was obtained by distillation under reduced pressure. No indium metal precipitates were observed even after the mixture was stored in a shading state for several days.

Figure 2:
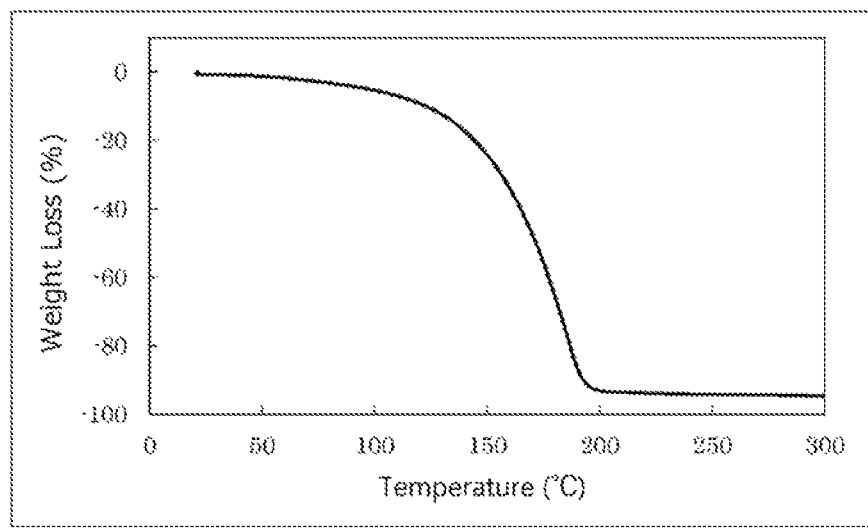
FIG. 2 shows the result of TG analysis in Example 2.

TG analysis of this liquid showed that any weight loss caused by other than vaporization of ethylcyclopentadienylindium was not observed as shown in FIG. 2. It is assumed that ethylcyclopentadiene and its dimerized form, diethylcyclopentadiene completely vaporized before the start of measurement. Presumably the reason why the weight loss did not reach 100% was because of the slight leakage of water in sampling and the effect of disproportionation. However, it reached nearly 100% as compared with Example 1.

Comparative Example 1

In a manner similar to Example 1, a pale yellow solid of ethylcyclopentadienylindium was obtained in a receiver cooled by dry ice. When melted in an inert gas, the solid became a pale yellow liquid, which immediately resulted in the precipitation of indium metal. When the pale yellow liquid was poured into an ampule filled with an inert gas, indium metal was immediately precipitated, and further when kept stored until the next day, the amount of precipitates increased and the color darkened.

This yellow liquid is regarded as high purity ethylcyclopentadienylindium; however, because it does not coexist with ethylcyclopentadiene or tris(ethylcyclopentadienyl)indium, disproportionation will soon occur, leading to the precipitation of metals. Consequently, the yellow liquid will easily cause blockage of pipes and valves when filled into a light-blocking container which is mountable on a chemical vapor deposition apparatus. Accordingly, it is not suitable for use as a precursor for chemical vapor deposition.

The invention claimed is:

1. A precursor for chemical vapor deposition consisting essentially of a liquid mixture of alkylcyclopentadienylindium (I) having a formula $C_5H_4R^1$—In wherein $R^1$ is an alkyl group having 1 to 4 carbon atoms as a main component, and one or more secondary component selected from the group consisting of alkylcyclopentadiene having a formula $C_5H_5R^2$ wherein $R^2$ is an alkyl group having 1 to 4 carbon atoms, dialkylcyclopentadiene having a formula $(C_5H_5R^3)_2$ wherein $R^3$ is an alkyl group having 1 to 4 carbon atoms, trisalkylcyclopentadienylindium (III) having a formula $(C_5H_4R^4)_3$—In wherein $R^4$ is an alkyl group having 1 to 4 carbon atoms and triscyclopentadienyl indium (III), the number of carbon atoms of $R^1$ to $R^4$ being equal,
wherein the precursor does not comprise any solvents, and
wherein the precursor is a liquid at 23° C. under ordinary pressure.

2. The precursor for chemical vapor deposition according to claim 1, wherein the number of carbon atoms of all $R^1$ to $R^4$ is 2.

3. The precursor for chemical vapor deposition according to claim 1, wherein a total amount of hydrogen of alkylcyclopentadiene, dialkylcyclopentadiene and trisalkylcyclopentadienylindium (III) to an amount of hydrogen (integrated value) of alkylcyclopentadienylindium (I), measured by $^1$H-NMR, is 0.01 or more and less than 0.5.

4. A light-blocking container mountable on a chemical vapor deposition apparatus, wherein the light-blocking container is charged with the precursor for chemical vapor deposition according to claim 1.

5. The light-blocking container according to claim 4, wherein an amount of In metal contained in the precursor for chemical vapor deposition is 0.5 wt % or less.

6. A method of manufacturing a light-blocking container containing the precursor for chemical vapor deposition according to claim 1, mountable on a chemical vapor deposition apparatus, comprising:
a step 1 of preparing a precursor by allowing alkylcyclopentadienylindium (I) ($C_5H_4R^1$—In; $R^1$ is an alkyl group having 1-4 carbon atoms) as a main component to coexist with one or more selected from alkylcyclopentadiene ($C_5H_5R^2$; $R^2$ is an alkyl group having 1-4 carbon atoms), dialkylcyclopentadiene (($C_5H^5R^3)_2$; $R^3$ is an alkyl group having 1-4 carbon atoms), trisalkylcyclopentadienylindium (III) (($C_5H_4R^4)_3$—In; $R^4$ is an alkyl group having 1-4 carbon atoms) and triscyclopentadienylindium (III) as secondary components, and
a step 2 of charging a light-blocking container mountable on a chemical vapor deposition apparatus with the precursor in an inert gas.

7. A light-blocking container mountable on a chemical vapor deposition apparatus, wherein the light-blocking container is charged with the precursor for chemical vapor deposition according to claim 3.

8. The light-blocking container according to claim 7, wherein an amount of In metal contained in the precursor for chemical vapor deposition is 0.5 wt % or less.

* * * * *